United States Patent [19]

Hodge

[11] Patent Number: 5,432,666
[45] Date of Patent: Jul. 11, 1995

[54] SELF-RESTORING FAULT CURRENT LIMITER UTILIZING HIGH TEMPERATURE SUPERCONDUCTOR COMPONENTS

[75] Inventor: James D. Hodge, Lincolnwood, Ill.

[73] Assignee: Illinois Superconductor Corporation, Evanston, Ill.

[21] Appl. No.: 8,040

[22] Filed: Jan. 22, 1993

[51] Int. Cl.⁶ ............................................... H02H 9/00
[52] U.S. Cl. ...................................... 361/19; 361/93; 361/141
[58] Field of Search ........................... 361/19, 141, 93

[56] References Cited

U.S. PATENT DOCUMENTS

| | | | |
|---|---|---|---|
| 4,189,693 | 2/1980 | Satti | 335/216 |
| 4,486,800 | 12/1984 | Franksen | 361/19 |
| 4,763,404 | 8/1988 | Coffey et al. | 29/599 |
| 4,845,308 | 7/1989 | Womack, Jr. et al. | 174/15.4 |
| 4,924,198 | 5/1990 | Laskaris | 335/216 |
| 4,961,066 | 10/1990 | Bergsjo | 361/19 |
| 4,994,932 | 2/1991 | Okamoto et al. | 361/19 |

OTHER PUBLICATIONS

"A Superconducting Fault-Current Limiter," K. E. Gray et al., *J. Appl. Phys.*, vol. 49, No. 4, Apr. 1978.
"A Current Limiting Device Using Sueprconducting D.C. Bias Applications and Prospects," B. P. Raju et al., *IEEE Transactions on Power Apparatus and Systems*, vol. PAS-101, No. 9, Sep. 1982.
"Superconducting Fault Current Limiter and Inductor Design," J. D. Rogers et al., *IEEE Transactions on Magnetics*, vol. MAG-19, No. 3, May 1982.
"Fault Current Limiter Using a Superconducting Coil," H. J. Boenig et al., *IEEE Transactions on Magnetics*, vol. MAG-19, No. 3, May 1983.
"Performance of a Vacuum Arc Commutating Switch For a Fault-Current Limiter," P. D. Pedrow et al., *IEEE Transactions on Power Apparatus and Systems*, vol. PAS-102, No. 5, May 1983.
"Current Limiting Device-A Utility's Need," C. A. Falcone et al., IEEE Power Engineering Society Paper T 73 470-2, presented by title for written discussion at the IEEE PES Winter Meeting, New York, N.Y., Jan. 27-Feb. 1, 1974.
"Fault Current Limiters-An Overview of EPRI Research," V. H. Tahiliani et al., *IEEE Transactions On Power Apparatus and Systems*, vol. PAS-99, No. 5, Sep.-/Oct. 1980.
"Thin Film Superconducting Switches," K. E. Gray et al., *IEEE Transactions on Magnetics*, vol. MAG-15, No. 1, Jan. 1979.
"NbN Materials Development For Practical Superconducting Devices," R. T. Kampwirth et al., *IEEE Transactions on Magnetics*, vol. MAG-17, No. 1, Jan. 1981.
"High-Temperature Superconductors For Space Power Transmission Lines," J. R. Hull et al., presented at The Winter Annual Meeting of The American Society of Mechanical Engineers, Dec. 10-15, 1989.
"Reliability Implications in the Design of Fault Current Limiters," P. Barkan, *IEEE Transactions on Power Apparatus and Systems*, vol. PAS-99, No. 5, Sep./Oct. 1980.
"Advantages of High-Temperature Superconductivity in Large-Scale Applications," ASME Winter Annual Meeting, Published in MD-vol. 11, pp. 1-7, Nov.-Dec. 1988.
"Low Operating Voltage Superconducting Current Limiter," M. A. Hilal et al., presented at the proceedings of the 1991 Cryogenic Engineering Conference, Huntsville, Ala., Jun. 11-14, 1991.

Primary Examiner—Marc S. Hoff
Assistant Examiner—S. Jackson
Attorney, Agent, or Firm—Reinhart, Boerner, Van Deuren, Norris & Rieselbach

[57] ABSTRACT

A fault current limiter incorporating a high temperature superconductor material. During a fault condition, the superconductor material is allowed to operate above its critical temperature, providing sharply increased resistance. The fault current limiter can be sized and selectively cooled to provide a desired range of fault current limiting capability.

22 Claims, 12 Drawing Sheets

SELF-RESTORING FAULT CURRENT LIMITER UTILIZING HIGH TEMPERATURE SUPERCONDUCTOR COMPONENTS

This invention was made with government support under Contract No. DAAL01-91-C-0140, awarded by The Department of Defense. The government has certain rights in this invention.

BACKGROUND OF THE INVENTION

The present invention generally relates to using a high temperature superconductor (HTSC) in a fault current limiter. More particularly, the present invention relates to a resistive fault current limiter which allows the HTSC to operate above its critical temperature. A particularly useful form of the invention relates to an HTSC fault current limiter which provides a higher faulted state resistance and a sharper increase in resistivity with increasing current than prior art devices.

A fault current is generally defined as a temporary and substantial increase in current carried by a power system. Such a fault, caused by equipment shorts and EMI induced current surges, can severely damage any electronic equipment associated with the faulted system.

Early attempts to address the problems associated with fault currents involved designing all equipment and instruments connected to a given power system to withstand an anticipated maximum fault current. Consequently, power systems, along with the related equipment and instruments, were over-designed and engineered, increasing the overall cost, weight, and size of such systems.

Where utilized, a fault current limiter is generally either a switched or unswitched device. With respect to the latter, current is commuted from a low impedance main path to a higher impedance shunt path by one of several available switching means. The fault current must be commuted within a short time (typically less than half the period of a 60 hertz cycle, i.e., less than about 8 milliseconds), necessitating synchronized operation and complex equipment and construction.

Unswitched devices of the prior art include those which have no impedance in the normal state, but exhibit an increase thereof when the current exceeds a specified threshold. Alternatively, unswitched devices have included various in-line fuse devices which change phase and generate high-arc voltages. While these unswitched devices of the prior art have demonstrated some utility, most are plagued with performance capability problems. In addition, all are prohibitive from an initial cost perspective and are expensive to maintain.

The search for an effective, efficient fault current limiter has been an on-going concern in the art. Most recently, such devices have incorporated superconductors, which change to a normal resistance state when the current exceeds a prescribed limit. Such devices of the prior art are designed to maintain the superconductor component under isothermal conditions, below the critical temperature. Such devices tend to have a low and often-times inadequate faulted resistance state and do not exhibit a sufficient increase in resistivity with increasing current.

The ideal characteristics of a fault current limiter have been described as:

1) Limitation of first peak of fault current;
2) Low impedance and low energy losses in the normal state;
3) No unacceptable harmonics in the normal state;
4) Inherently automatic operation with no specialized detection and control devices;
5) Smooth and gradual change of impedance, normal to fault and vice versa;
6) Compactness;
7) Fail safe operation;
8) Modest cost.

It is therefore an object of the invention to provide an improved fault current limiter meeting one or more of the characteristics described above.

It is another object of the invention to provide a novel fault current limiter incorporating a high temperature superconductor operable under quasi-adiabatic conditions.

It is yet another object of the invention to provide an improved high temperature superconductor fault current limiter capable of producing a higher faulted state resistance.

It is a further object of the invention to provide an improved high temperature superconductor fault current limiter which provides a sharper increase in resistivity with increasing current.

It is another object of the invention to provide a high temperature superconductor fault current limiter such that resistivity is a function of superconductor size, whereby resistivity is a design parameter for the limiter device.

It is yet another object of the invention to provide a novel fault current limiter which is capable of automatically returning to a nonlimiting state after a fault current limiting operation.

It is yet another object of the invention to provide an improved fault current limiter having resistance controllable by selective cooling of a superconductor material.

It is a further object of the invention to provide a novel fault current limiter operable above its critical temperature during a fault current limiting operation.

It is a still further object of the invention to provide an improved fault current limiter operable in conjunction with a circuit breaker.

It is yet another object of the invention to provide a novel fault current limiter having its period of operation controlled by a conventional circuit breaker.

Other objects, features and advantages of the present invention will be readily apparent from the following description of the preferred embodiments thereof, taken in conjunction with the accompanying drawings described below wherein like elements have like numerals throughout the several views.

BRIEF DESCRIPTIONS OF THE DRAWINGS

DETAILED DESCRIPTION OF PREFERRED EMBODIMENTS

While many HTSC materials can be used interchangeably and equivalently in a fault current limiter constructed in accordance with one form of the invention, $YBa_2Cu_3O_{7-x}$ is described for illustrative and non-limiting purposes. Various fabrication methods are described in the Examples section hereinafter for preparing conductors for the fault current limiter.

Figure 2:
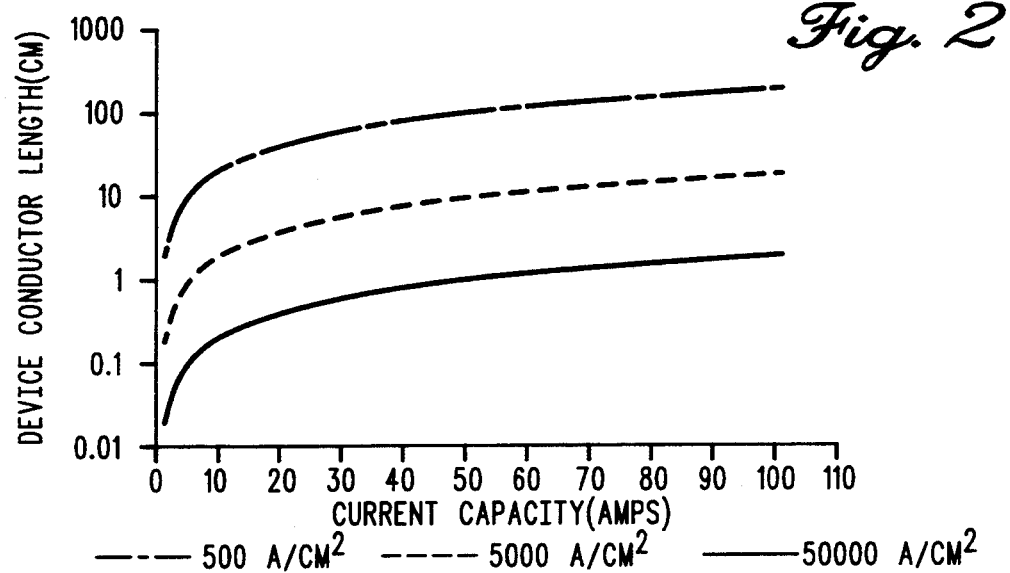
FIG. 2 illustrates design criteria for a one ohm fault current limiter.
Figure 3:
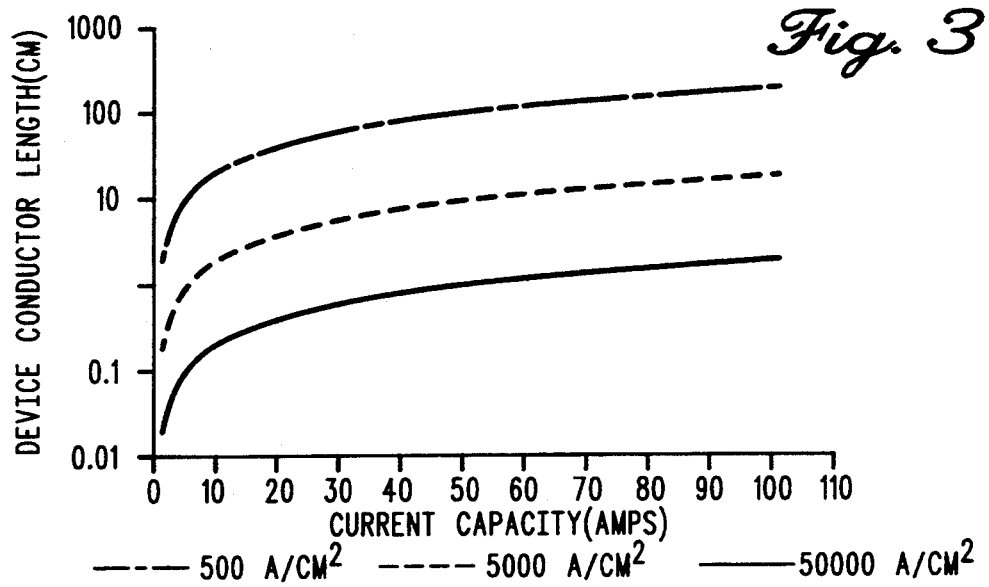
FIG. 3 shows design criteria for a ten-ohm fault current limiter.

Electrically, a fault current limiter is essentially defined by the current it is required to carry in its normal, unfaulted state and by the resistance it presents to the system during a fault. These requirements, in turn, define the dimensions of the conductor required in a HTSC-based fault current limiter. The cross-section of conductor required in a current limiter is defined by the current carrying capacity of the device in its normal operating state, i.e., the current the device must carry while it is in its superconducting state. The minimum conductor cross-section is thus given by:

$$A = \frac{I_{normal}}{J_c}$$

where $I_{normal}$ is the normal operating current of the device. If the faulted state resistance of the device is fixed by the application requirements, the overall length of conductor required is determined by this cross-sectional area and the faulted state resistivity of the superconductor:

$$L = \frac{R_f A}{\rho_f}$$

where $R_f$ is the fault state resistance of the device and $\rho_f$ is the faulted state resistivity of the superconductor. To a first approximation, the design criteria for a HTSC-based fault current limiter can be established by using the normal state resistivity of the superconductor extrapolated to the temperature of device operation as a design value for $\rho_f$. FIGS. 2 and 3 illustrate device conductor length versus current capacity for three different values of critical current density. FIG. 2 shows the calculation for a 1 ohm device and FIG. 3 shows a similar calculation for a 10 ohm device. In both cases, a faulted state resistivity of 1 m$\Omega$-cm ($\rho_n^{77 K}$) was used. Note that the current density values used for these calculations have all been reported on practical, bulk $YBa_2Cu_3O_{7-x}$ samples in the literature.

However, it is important to note that $\rho_f$ is not the normal state resistivity of the superconductor extrapolated to the temperature of operation, i.e., 77 K. The electrical dissipation that occurs as a superconductor exceeds its critical current density is of an entirely different nature than that which gives the ohmic behavior of a conventional conductor.

In polycrystalline high temperature superconductors, where critical current densities are largely determined by weakly coupled proximity junctions at grain boundaries, numerous mechanisms for this dissipation have been proposed. These mechanisms range from percolation through weak-link networks to either intra- or inter-granular vortex motion. None of these models has been found to satisfactorily describe the behavior of HTSC materials in the region above their critical current density. Consequently, the true nature of electrical dissipation in high temperature superconductors is not yet well understood.

However, while the mechanisms responsible for electrical dissipation above the critical current density are poorly understood, the dependence of this dissipation on current density has been determined experimentally and been found to obey a number of straightforward, empirical rules. Without limiting the scope of this invention, the I-V behavior of a typical polycrystalline HTSC material is shown schematically in FIG. 5.

Figure 4:
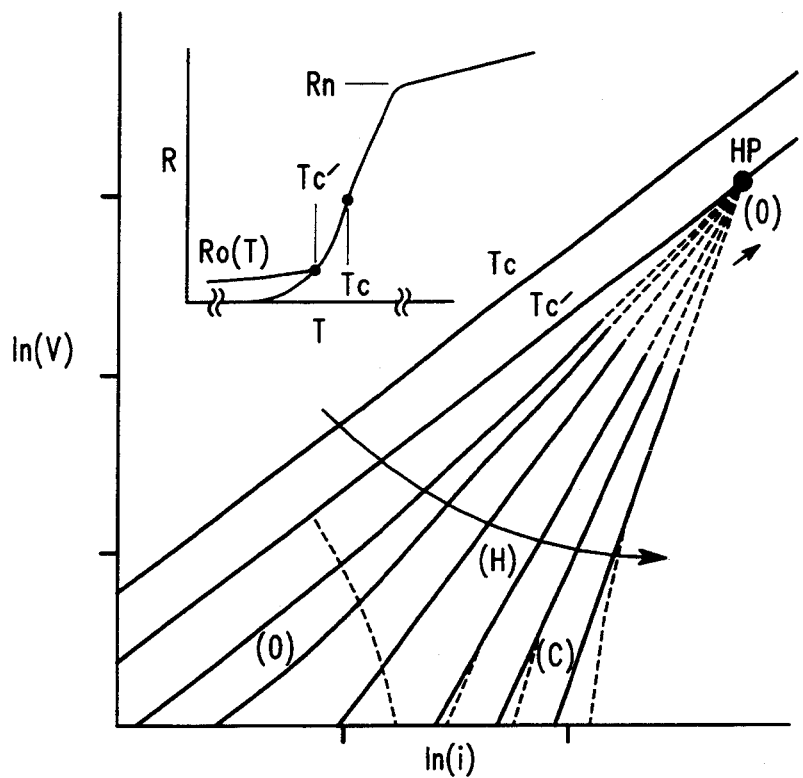
FIG. 4 shows a schematic of typical I–V characteristics of polycrystalline high temperature superconductors.

As illustrated, measuring the I-V characteristics of a given superconductor over a range of temperatures (the arrow in FIG. 4 indicates the direction of decreasing temperature) generates a family of curves that can be extrapolated upwards to a common point, referred to as a "hinge point". As illustrated, below a temperature, $T'_c$, the I-V behavior is distinctly nonlinear, especially in the regime of low temperatures characteristic of the operating temperature of one embodiment of the fault current limiter device (corresponding to region 'C' in the figure). However, as either $T'_c$ or high fields are approached, the behavior of the superconductor becomes more and more ohmic. Eventually, the behavior approaching an apparent resistivity, $\rho_0$15, as illustrated in the FIG. 4 inset. It is $\rho$ that is the true design value for a HTSC-based fault current limiter.

An important question in the design of the HTSC conductors to be used in a fault current limiter is whether to use a single monolithic conductor or a bundle of small diameter filaments. As the primary factor for deciding between these two conductor configurations is the thermal behavior of the device during a fault, the heat rise in a conductor during a fault was modeled. Two approaches were taken: (1) A heat-rise calculation based on an adiabatic response during a fault; and (2) An isothermal heat flow calculation assuming that the surface of the device remains at 77 K. (liquid nitrogen temperatures).

An accepted solution for heat production in an infinite cylinder with an initial and surface temperature of zero is given by:

$$T(r) = \frac{A_0(a^2 - r^2)}{4K} - \frac{2A_0}{aK} \sum_{n=1}^{\infty} \exp(-\kappa a_n^2 t) \frac{J_0(r a_n)}{J_1(r a_n)}$$

Here, "a" is the cylinder radius, K is the material thermal conductivity, $\kappa$ is the material thermal diffusivity, $J_0$ and $J_1$ are Bessel functions, and the $a_n$ are the positive roots of $J_0(a a_n)=0$. $A_0$ is a heat production rate that in the case of a fault in a current limiter with HTSC conductors is given by:

$$A_0 = \frac{\rho_0}{\pi^2 a^4} i^2$$

Here, $\rho_0$ is the faulted state resistivity of the superconductor (discussed above) and i is the fault current.

Conductor temperature rise calculations were made for both of these models using the appropriate formulas, device parameters, and material properties built into a spreadsheet that calculates this temperature increase as a function of time and fault current level. For each device configuration, the response is calculated for 110%, 200%, and 1000% of the device's rated current. Note that the faulted state resistance used in the adiabatic calculation is substantially higher than that used for the isothermal calculation. This is due to the fact that it is assumed that the adiabatic device will heat up sufficiently to exceed the critical temperature of the superconductor (90 K for $YBa_2Cu_3O_{7-x}$). Consequently, the material's normal state resistivity is used for this calculation. In contrast, for the isothermal case, the bulk of the conductor remains below the material's critical temperature and the value of the dynamic resistance $P_0$, is used. Similar adjustments in the thermal conductivity and specific heat, both temperature sensitive properties, have also been made.

These results represent a first approximation to the actual performance of the device during a fault. The accuracy of the results obtained for these models are limited by the assumptions going into the calculation, i.e. 1) There is a constant current during a fault; 2) $YBa_2Cu_3O_{7-x}$ resistivity is independent of temperature, and 3) $YBa_2Cu_3O_{7-x}$ thermal conductivity is independent of temperature. In another form of the invention, other conditions can be analyzed which take into account the dV/di characteristics of $YBa_2Cu_3O_{7-x}$ operating in the vicinity of its critical current, and model the cooling efficiency of boiling liquid nitrogen at high conductor surface temperatures. However, the first approximation calculation effectively describes the pertinent design conditions for both adiabatic and isothermal devices.

Due to the length of material involved, the superconductor filament bundles are preferably made of short segments, connected in series and arranged in a serpentine pattern to minimize the device size and liquid nitrogen requirements. This design benefits from low resistivity and compliant connections between filaments. Another design consideration involves adequately supporting the individual filaments or filament bundles while allowing free circulation of liquid nitrogen around and within the bundles. The bundle is preferably supported in such a manner as to allow it to freely expand and contract in response to temperature changes.

Two types of temperature changes are viewed as being significant: (1) Changes associated with installation and maintenance, i.e., slow cycling between liquid nitrogen and room temperatures; and (2) Temperature excursions associated with a fault. Compensating for dimensional changes associated with these temperature changes presents unique challenges in the case of $YBa_2Cu_3O_{7-x}$ (and other HTSC compounds) because the intrinsically low mechanical strength of these materials makes them less susceptible to accommodate any substantial applied forces.

Figure 5:
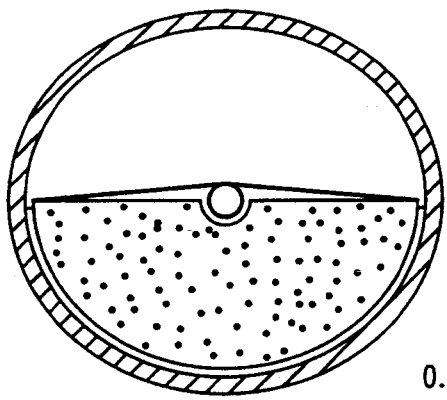
FIG. 5 illustrates a cross-sectional view of a filament mounting assembly.

Techniques have been developed for compliantly supporting single filaments of $YBa_2Cu_3O_{7-x}$ for the production of its liquid nitrogen level sensor. One technique involves the use of inexpensive polymeric materials and has proven very effective in protecting fine filaments of $YBa_2Cu_3O_{7-x}$ from damage during thermal cycles and mechanical shocks associated with handling. FIG. 5 shows a cross-section of this filament mounting.

An important feature of this mounting technique is the use of a nylon mesh to restrain the filament during mechanical shocks while freely allowing the filament to expand and contract, independent of the rest of the structure, during thermal cycling. Mechanical shock is also attenuated through the use of a polyurethane foam "bed" to rest the filament on as well as a compliant polymer adhesive to attach the inner half-round mount to the outer jacket. As this restraining technique compensates for any thermal expansion mismatch between the filament and mounting structure, a wide variety of materials can be used for the outer tube and inner half-round, including stainless steel, fiberglass and glass.

In tests, filaments mounted in the above-described fashion have survived more than 200 thermal cycles between room temperature and 77 K. and multiple drops from 3 feet without fracture or degradation of their electrical properties. Further information on this mounting technique can be found in U.S. Pat. No. 5,114,907 (Erwin, et al.) (owned by the Assignee of the instant application) which is incorporated by reference herein in its entirety.

This mounting technique is well adapted to use in fault current limiters designed in accordance with one form of the invention. In addition to the effective mechanical support provided for the filament or filament bundles, the use of nylon mesh in conjunction with a perforated outer tube insures the free circulation of cooling fluid, liquid or gas around the surface of the conductor.

A number of sample filament and filament bundle mounts were made to determine the adaptability of this technology to fault current limiter design. All of these mounts utilized G-10 fiberglass/epoxy tubing for both the outer jacket and inner half-round (0.95 cm outer jacket OD) and were made to accommodate a conductor length of 30 cm. These mounts and their associated filaments and filament bundles were used in the device testing program described herein.

A device was constructed with a superconducting current carrying capacity of 10 amps and a normal state resistance of 10 ohms (as determined by the extrapolation Of $p_n$). Based on previous characterization of single filaments and multifilament bundles, such a device would require a bundle of three 0.9 mm diameter filaments 7.6 m long. Given the length of conductor required, the device was constructed using twenty-five 30 cm long component bundles connected in series.

To make this device, 0.9 mm filaments were fired in 90 cm lengths. After firing, these 90 cm lengths were cut into 32.5 cm lengths. To assemble the bundles, three of these lengths were placed in a specially prepared jig and cemented together by painting the ends of the bundle with the in-house prepared silver paint comprising commercial silver powder suspended in an organic vehicle. A separate set of voltage taps was also painted on with this silver paint ~1 cm in from the end contacts. Once the paint was dried, the assembled bundles were refired to 800° C. to sinter the silver contacts and then annealed in oxygen on a 6° C./hr ramp from 670° C. to 350° C. to develop the material's superconducting properties.

Eighteen gauge solid copper wire was then attached to the ends of the finished bundles using pure indium solder. Voltage leads were provided to each bundle by indium soldering 30 gauge wires to the voltage tap pads. After electrical contacts had been made, the bundles were each mounted in a 6.4 mm half-round assembly described earlier. Each of these half-round assemblies were tested individually to determine their room temperature resistance, critical current at 77 K., and resistance at 77 K. while passing a 10 amp current.

All component bundles having a critical current of 4.5 amps or greater were subsequently mounted inside a 9.5 mm diameter outer jacket. The mounted bundles were then stacked together and connected in series by soldering their copper current leads together using 14 gauge solid copper wire. Terminals for the device were made using 14 gauge stranded copper wire. The individual bundles for the device were themselves bundled together using twisted copper wire. The assembled prototype device is pictured in FIG. 6. The overall dimensions of this device are 38 cm long by 5 cm square.

A number of different sample configurations were tested including short (4 cm) single filaments, long (30 cm) single mounted filaments, long mounted 3-filament bundles and the prototype fault current limiter device itself. All of the samples used in this program were configured with four fired-on silver contacts to provide four-point electrical connections. This testing program quantified the electrical dissipation in the HTSC conductor above the material's critical current density to determine the proper faulted resistivity to use in the design of the fault current limiter. In addition, the HTSC conductor was examined to determine the ability to dissipate heat created by Joule heating during a fault.

All measurements described in this section were performed using a facility controlled by a single 80286-based computer communicating over an IEEE-488 interface. The specific instruments used in the tests to be described were: a Keithley 195A Digital Multimeter, capable of 100 nV resolution and able to directly read temperature from a platinum resistance thermometer output, a Keithley 228A 100 W Current/Voltage Source, Electronic Measurements DC Power Supply, with a maximum 20 VDC, 250 A output, and a Keithley 199 Digital Multimeter/Scanner, capable of 1 $\mu$V resolution on 8 independent input channels.

An initial analysis of electrical dissipation involved determining resistance and temperature relationships using short (4 cm) single filaments at a variety of operating currents. Prior to this evaluation, both $T_c$ (at a sampling current of 10 mA) and $j_c$ (at 77 K.) were measured. Resistance versus temperature determinations were then made above and below both $T_c$ and $j_c$. This was accomplished by mounting the sample using thermally-conductive paste in a narrow groove cut in a stainless steel mounting block. A platinum resistance thermometer was attached to the back of this block to monitor the temperature. This assembly was then lowered into a dewar of liquid nitrogen.

Figure 6:
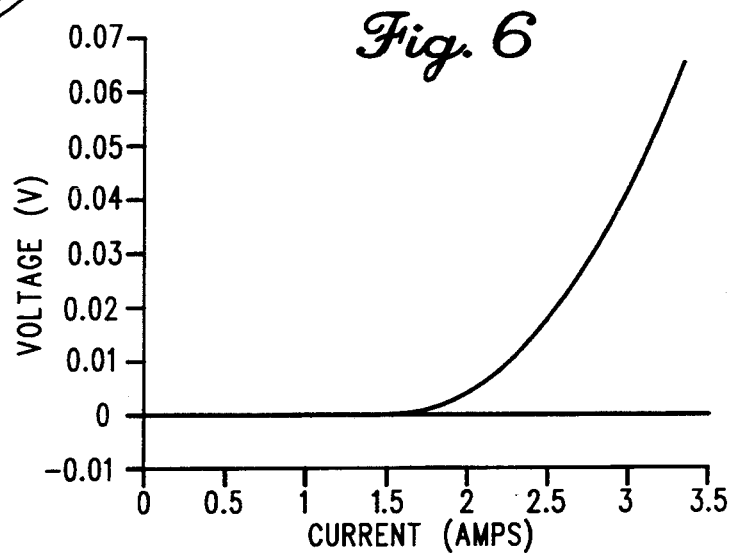
FIG. 6 shows a critical current measurement for a typical single filament.

Once the sample was equilibrated at 77 K., its $j_c$ was determined by ramping up the current stepwise while monitoring the voltage across the sample. To avoid complications due to contact heating, the current was 'pulsed' for 5 sec to make a voltage measurement and then switched off for 5 sec before making the next current step. A typical critical current measurement is shown in FIG. 6. After the completion of the $j_c$ test, the sample's $T_c$ was determined by slowly raising the stainless steel block out of the liquid nitrogen using a low-speed clock motor. By continuously monitoring both temperature and sample voltage, an accurate determination of the sample's critical temperature was made, as is shown in FIG. 8.

Figure 7:
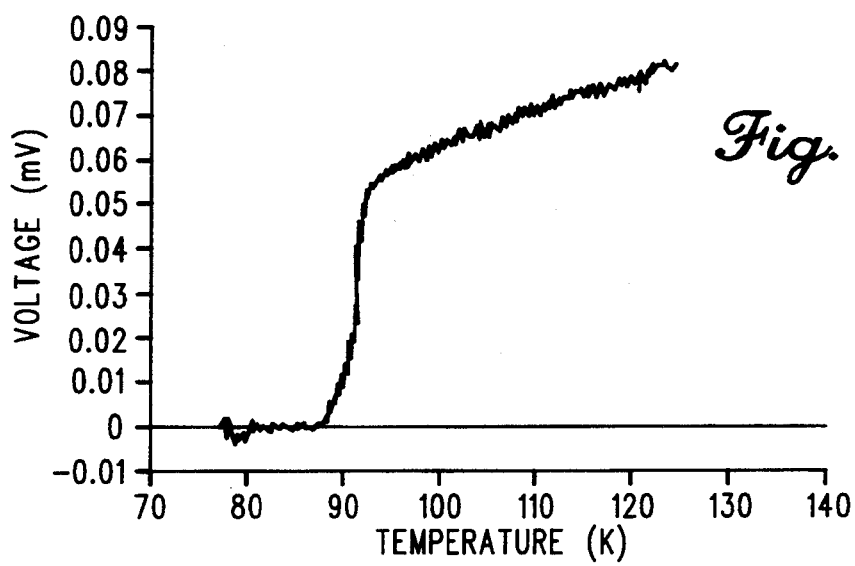
FIG. 7 illustrates a representative critical temperature measurement of a $YBa_2Cu_3O_{7-x}$ filament.

This same technique was used to examine electrical dissipation above the critical current density. For these measurements, the sample was again mounted in the stainless steel block and slowly raised out of the liquid nitrogen bath. However, to determine electrical dissipation, the sample was briefly (3 sec) pulsed at 30-second intervals with currents above its measured current density. In this way a curve similar to that shown in FIG. 7 could be generated at various operating currents. This data is shown in FIG. 8.

Figure 8:
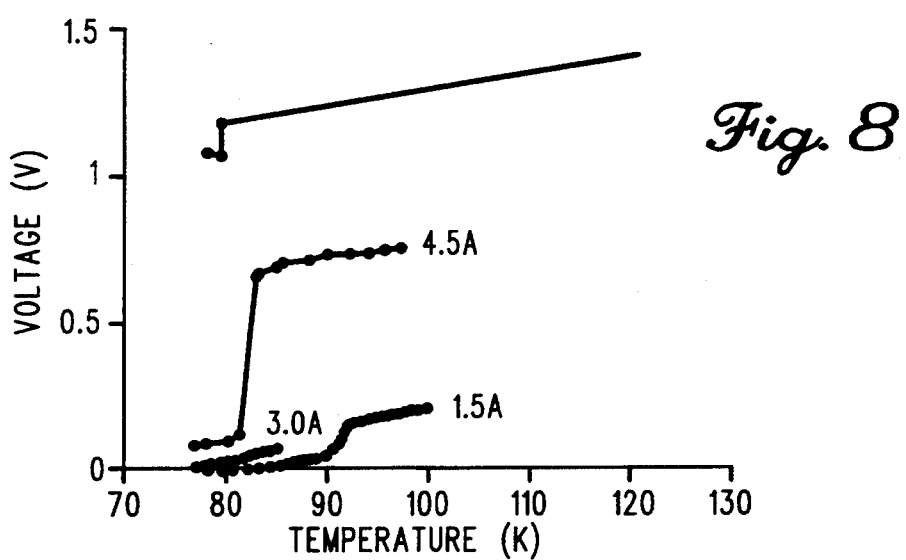
FIG. 8 shows electrical dissipation curves for the sample used to generate the critical temperature data in FIG. 8.

As evidenced by the apparent change in $T_c$ with operating current, the data in FIG. 8 do not represent a true picture of the electrical dissipation of the material in this temperature range. This is thought to be due primarily to Joule heating in the sample as a resistance develops, especially at higher temperatures (78–90 K.) where the sample is cooled only by nitrogen vapor. In spite of this, the results in FIG. 8 provide valuable information relative to the response of a HTSC-based current limiter during a fault. This is because the cooling of a practical current limiter will probably not be any more effective than the sample mounted on a stainless steel block.

These data indicate the following design regimes for HTSC-based current limiters: (1) A well-cooled regime where the conductor remains in contact with its liquid nitrogen coolant during a fault, and the resistance developed is solely due to the electrical dissipation in the superconductor above its critical current density; and (2) A pseudo-adiabatic regime where a relatively poorly cooled conductor rapidly heats up due to Joule heating and goes 'normal.'

For long sample tests, the standard sample used was a 30 cm long conductor mounted in the polyurethane foam/G-10 support structure. The rationale for these tests was twofold. First, mounting the conductor in the polyurethane foam support represents a substantially different thermal environment than was present with the short samples anchored to a relatively massive stainless steel block. These tests were designed to indicate whether this different environment changed the sample's response to a simulated fault. Second, the testing of long samples was also intended to evaluate the effect of potential spatial variations in the critical current density along the length of the sample on the sample's response to a simulated fault. This variation of the local critical current density with length, due to process-related sample nonhomogeneity processing, is well known in ceramic superconductors and has recently been modeled.

From this sample of 32 conductors fabricated from 96 filaments produced using identical starting materials and processing conditions, the average critical current is 5.34 A with a standard deviation of 0.94 A. The overall current density of a given conductor will be, to a large part, determined by the lowest local critical current density. It, therefore, would be expected that the local variation of the critical current density will be on this same order of magnitude.

Figure 9:
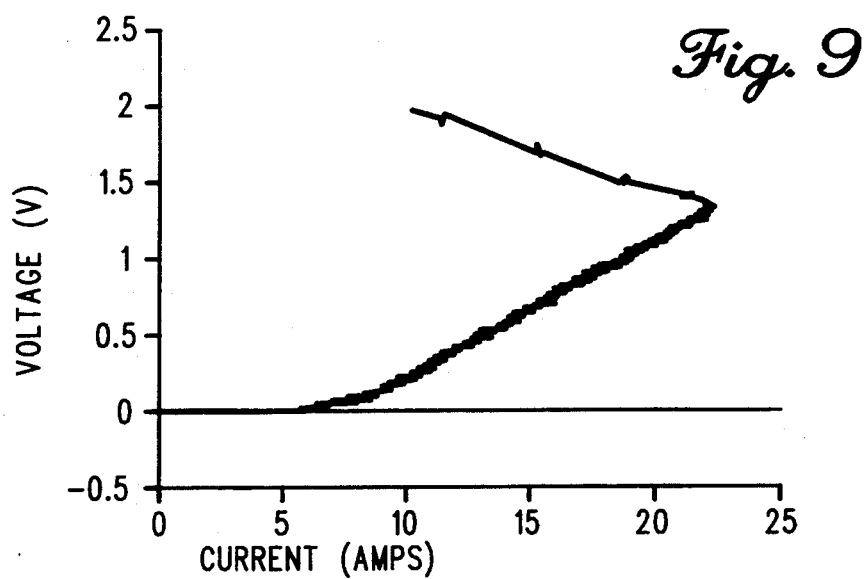
FIG. 9 illustrates a typical I-V response of a mounted 30-centimeter conductor.

In this regard, the I-V response of a number of 30 cm conductors were tested to failure to examine their expected response to a fault. The I-V response was determined in the same manner as that described for determining critical current previously. For these tests, a pulse length of 5 seconds was used. A typical response is shown in FIG. 9. The failure mode observed here (the increase in sample voltage coupled with a decreasing current) is typical and is an artifact of the current source used. Conductor failure occurs when the sample goes into thermal runaway and melting occurs. This melting is highly localized, generally occurring in a 2–3 mm section of the conductor. The I-V behavior observed during such a failure is due to the voltage output of the source used being limited to 10 V. When the conductor fails, the voltage required to drive the program through the sample exceeds this value and, consequently, the data taken after conductor failure represents the sample's response to a constant driving voltage.

Figure 10:
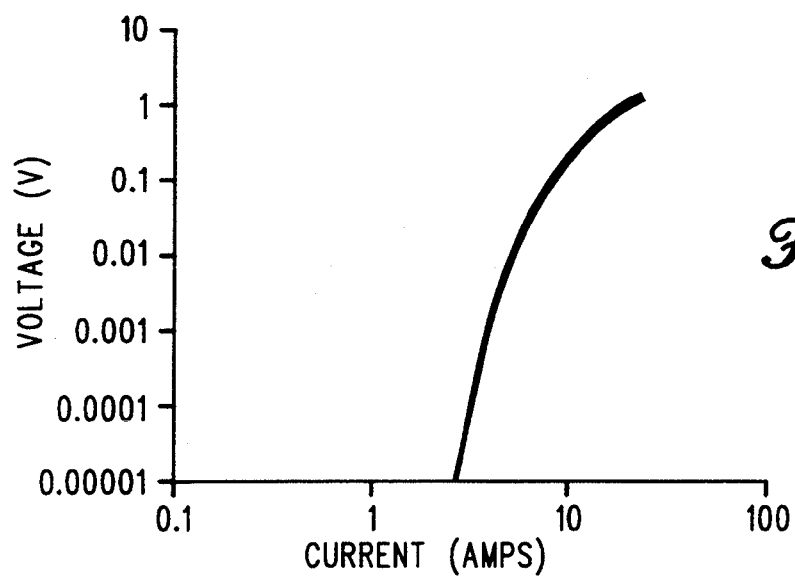
FIG. 10 shows a log-log plot of the I-V response of a typical 30 centimeter conductor.

The effect of the presumed spatial variation of critical current in these longer samples is most easily observed by plotting the sample's I-V response on a log-log plot as is done in FIG. 10. Comparison with the data in FIG. 6, shows that the transition is broadened over that observed for a short sample. This is as would be expected for a sample made up of a range of local critical current densities.

Figure 11:
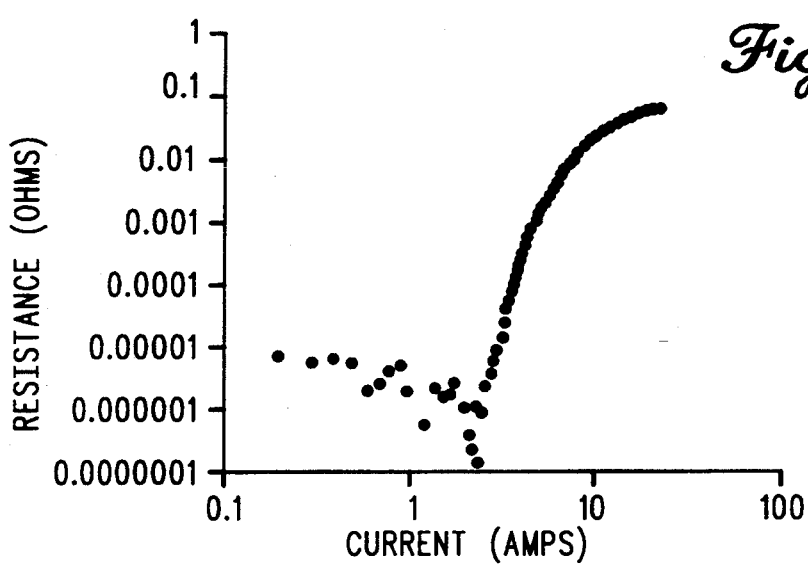
FIG. 11 illustrates a log-log plot of resistance versus current for a 30-centimeter sample showing its approach to $R_0$.

When the I-V data shown in FIG. 10 is converted to resistance versus current, as is done in FIG. 11, it can be seen that at the point of failure the superconductor was approaching its ultimate resistance. Consequently, this data allows calculation of $\rho_0$ for the sintered $YBa_2Cu_3O_{7-x}$ conductors at 77 K. Performing this calculation for a 30 cm long conductor gives a value for $R_0$ of $3.1 \times 10^{-5}$ ohm-cm.

Data further indicate how the thermal environment created by the polyurethane foam mounting is only a secondary effect at most on the performance of the superconductor during a simulated fault. It has been demonstrated that dynamic resistance (the I-V response of a superconductor above its critical current density) is a strong function of the sample's thermal environment by showing that in liquid the sample voltage is proportional to $I^4$ above the critical current density while in vapor it is proportional to $I^{14}$. Thus, for mounted samples, if the presence of the polyurethane foam limited the sample's ability to dissipate heat during a fault, it would be expected that the I-V curve shown in FIG. 10 would be steeper than the corresponding curve in FIG. 6. The implication is that any effect of a decreased thermal dissipation is washed out by the effect of the sample's spatial variation of critical current density.

In a separate test to determine the ability of a long sample to dissipate heat during a fault, a single 0.6 mm diameter filament mounted in a polyurethane foam/G-10 mount with a critical current of 1.15 A was pulsed with a 10 A current for increasingly long periods of time. The sample was first immersed in liquid nitrogen, and its critical current was determined as described above. Keeping the sample immersed, it was subject to 10 msec, 30 msec, 100 msec, 300 msec and 1 sec pulses of 10 A. The sample was checked before and after each pulse to determine that it remained intact and superconducting. Each pulse was repeated four times with no apparent effect on the sample's performance. When the pulse length was increased to 3 sec, the sample failed. This corresponds to an energy input of 88 joules and a heat flux at the filament surface of 14.7 joules/cm$^2$.

Figure 12:
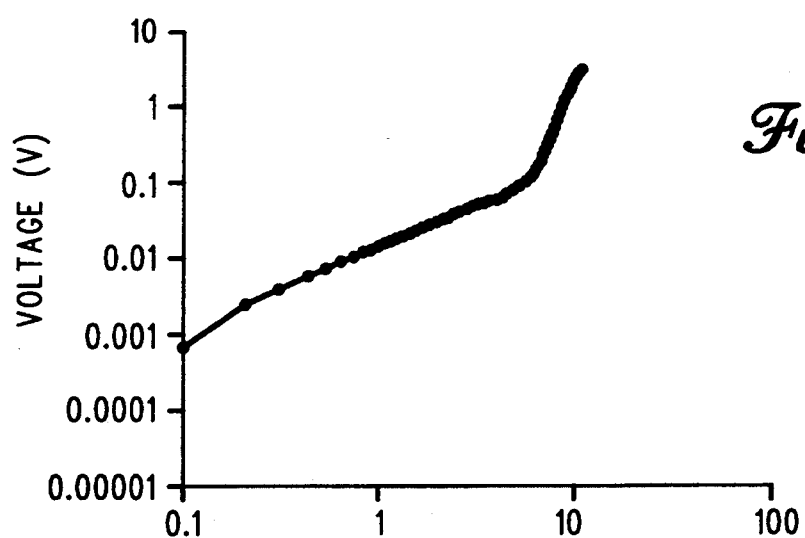
FIG. 12 shows the I-V response of a fault current limiter constructed in accordance with one form of the invention.

A fault current limiter device constructed as described previously was tested in DC. This testing consisted primarily of evaluating the device's critical current and its I-V response up to 10 amps. The results of this evaluation are illustrated in FIG. 12. This plot shows two regimes: (1) A low current, roughly ohmic regime that corresponds to the resistance of the copper interconnects while the superconductor still has a zero resistance; and (2) A high current regime that represents the true response of the superconductor. As would be expected from the data on long filaments, the current limiter is not yet ohmic at 10 amps. The extrapolated critical current of this device is 2.9 amps and the extrapolated $R_0$ is 1.22 ohms. Comparing the data in FIG. 12 with that of FIG. 10 shows that the transition for the device has approximately the same width as that of the long sample. This is consistent with the assumption that the local variation of the critical current density within a given conductor is on the same order of magnitude as the variation measured on the conductors themselves.

Figure 13:
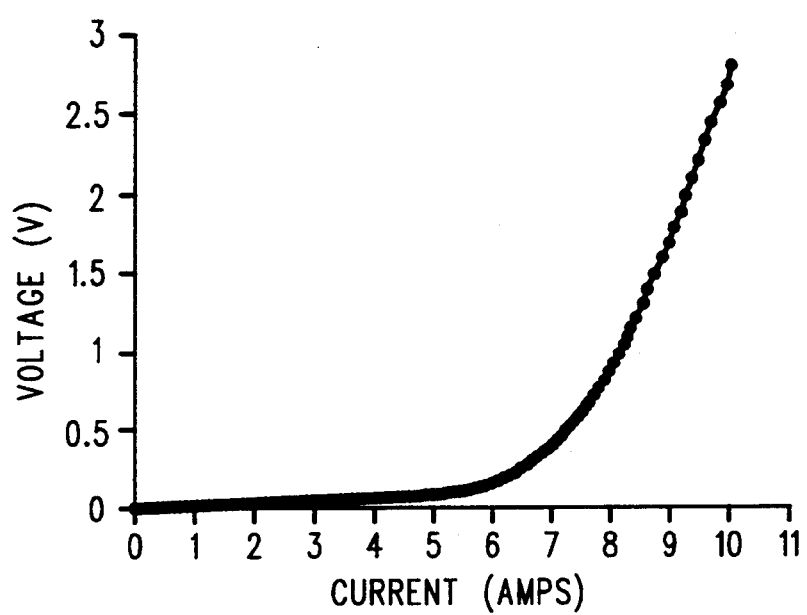
FIG. 13 illustrates the I-V response of a fault current limiter at various pulse lengths.

The data in FIG. 12 were taken using 2 second pulses. To determine if this I-V response was affected by the length of the current pulse used to make the measurement, the test was repeated using 4 second pulses and 0.5 second pulses. The results of these tests are plotted in FIG. 13 and indicate that the I-V results are independent of pulse length.

Figure 14:
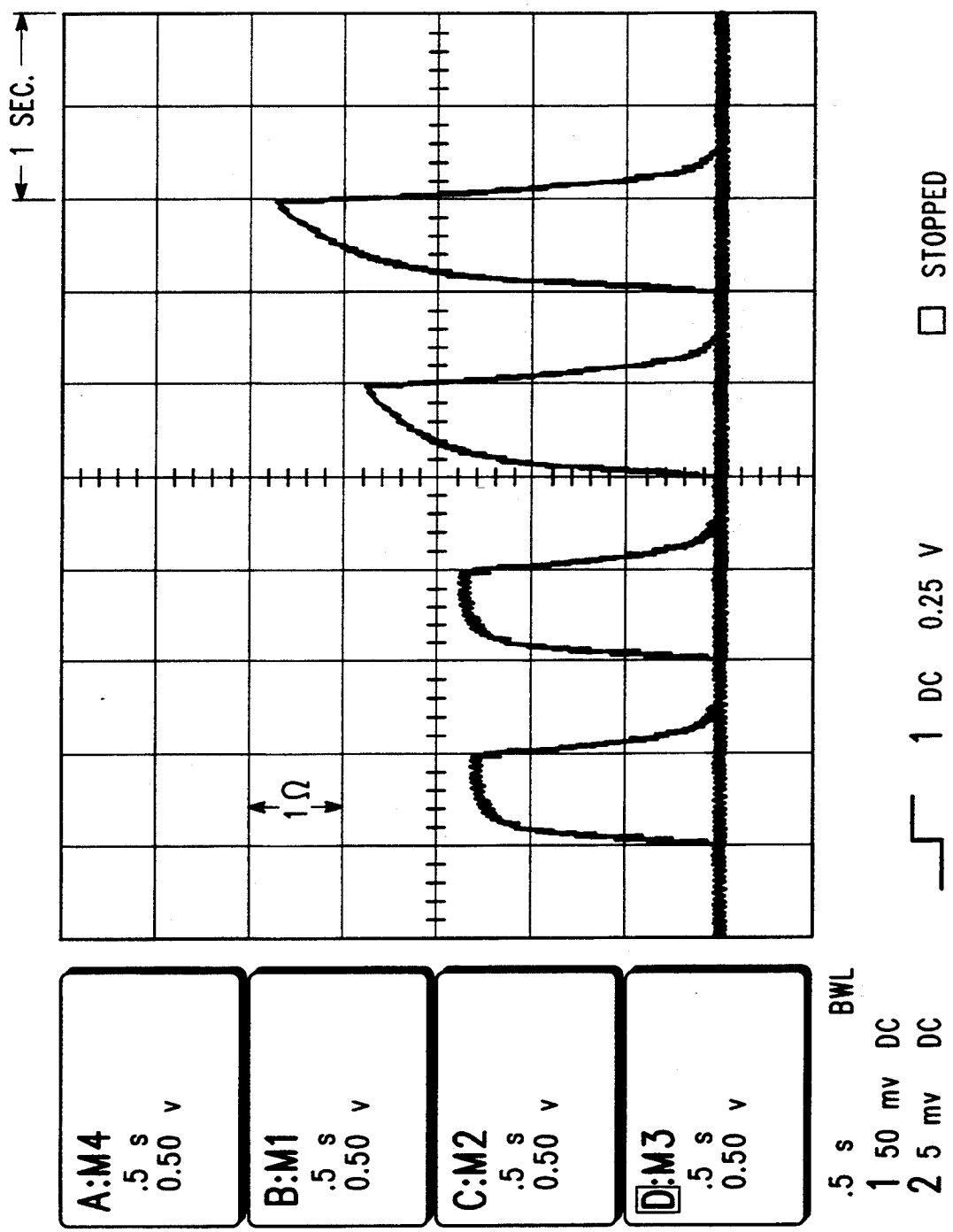
FIG. 14 shows an electrical circuit including a fault current limiter constructed in accordance with one form of the invention.
Figure 15:
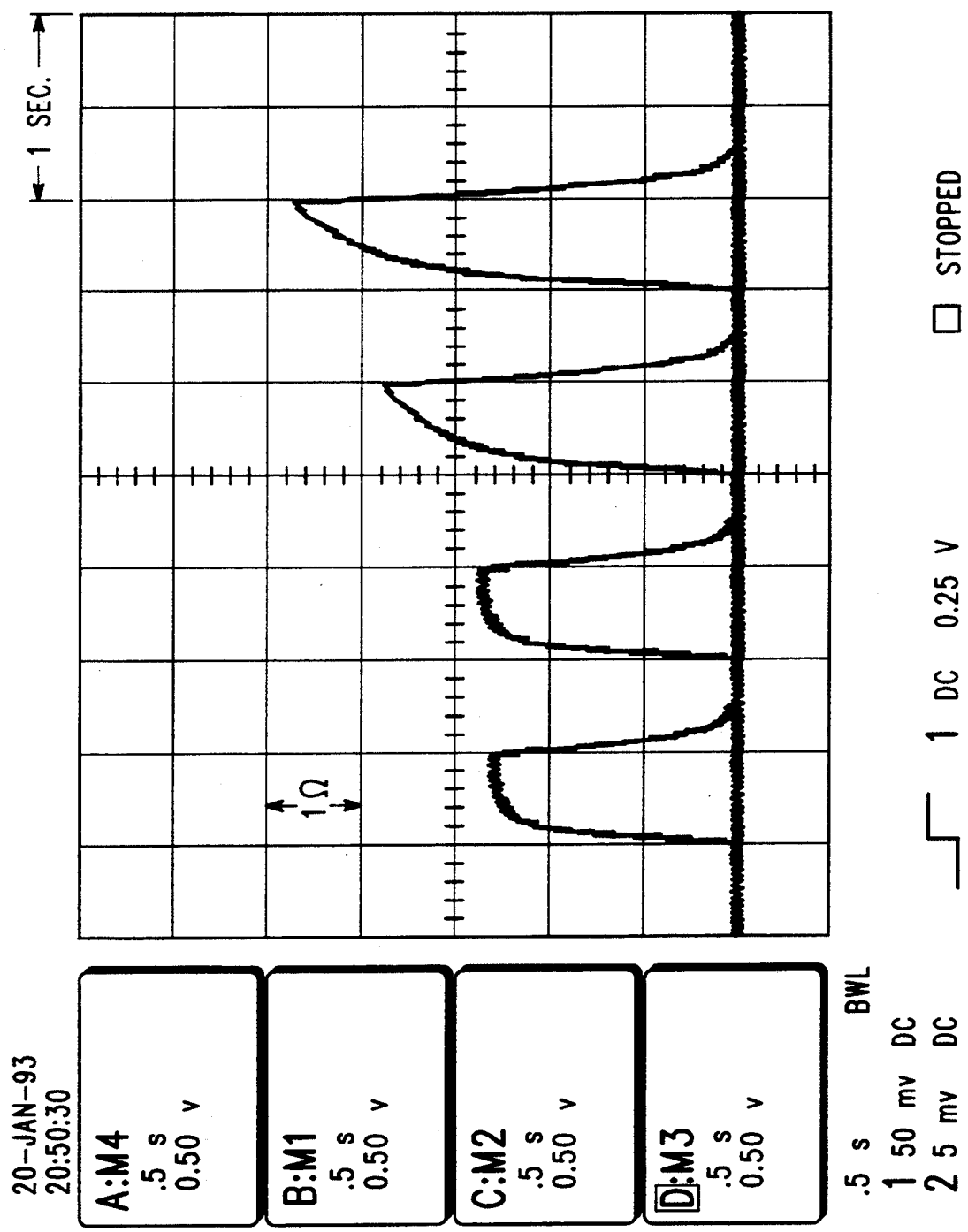
FIG. 15 shows resistance versus time measurements of a fault current limiter first immersed in liquid nitrogen, then in contact with liquid nitrogen, and then cooled by liquid nitrogen vapor.

Referring to the figures, and more particularly to FIG. 14, an electrical circuit including a fault current limiter constructed in accordance with one form of the invention is indicated generally at 10. The fault current limiter 10 is cooled by a cryogenic package 12. The fault current limiter 10 can be immersed in the cryogenic package 12. The fault current limiter 10 is electrically connected in series between mechanical circuit breaker 14.

The mechanical circuit breaker 14 has an inherent delay due to its mechanical components. Conventional mechanical circuit breakers typically have a response time to a fault current of approximately eight milliseconds. It is during this delay time that the fault current limiter 10 absorbs the fault current. This prevents the fault current from the system power source 16 from damaging the system equipment 18.

Optionally, an over current resistive shunt 20 can be electrically connected in parallel with the fault current limiter 10 to protect the fault current limiter 10 during an extraordinarily large fault current. During a typical fault current attenuation, the over current resistive shunt 20 would generally not be utilized.

Figure 16:
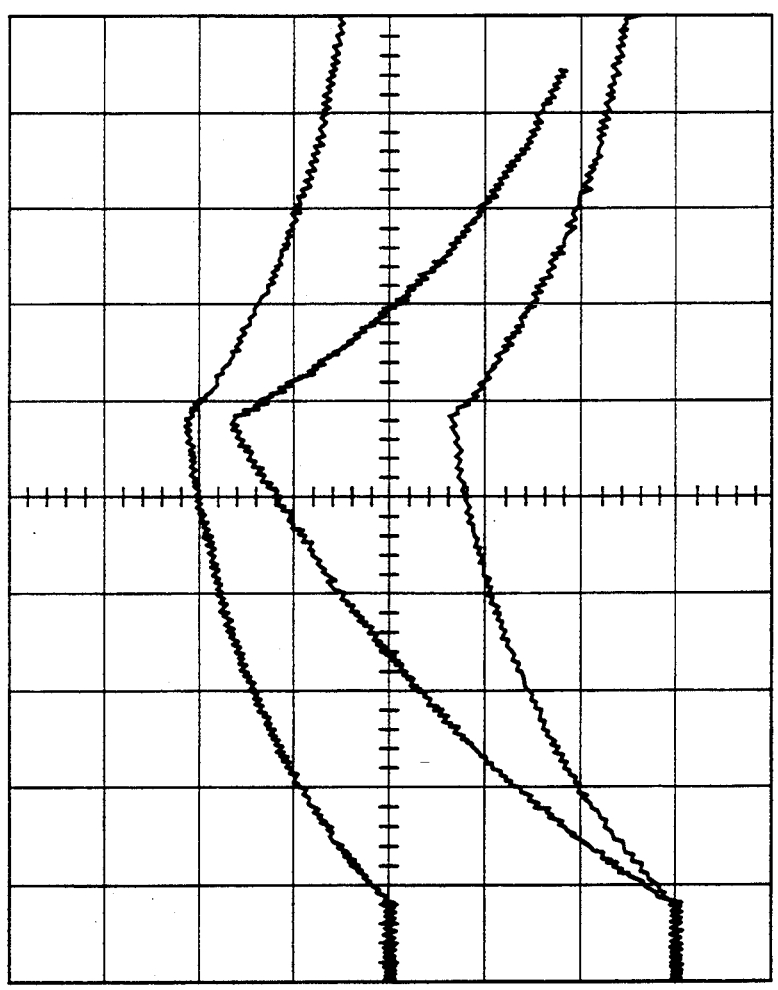
FIG. 16 shows a comparison of current source rise time with fiber superconductor resistance, with cooled and immersed fibers.

While experimental work has demonstrated that liquid nitrogen at 77 K. can be an effective coolant for a HTSC-based fault current limiter operating in a near-isothermal mode, the extremely low faulted state resistance of such a device would limit its utility for most practical applications. This problem can be overcome by designing a 'pseudo-adiabatic' device that would operate above the material's critical temperature during a fault. This would be accomplished most straight-forwardly by carefully controlling the cooling of the conductor during a fault. This controlled cooling could range from an insulated conductor in quiescent vapor to a conductor cooled in a flowing gas stream. FIG. 16 illustrates the effect of vapor cooling versus liquid cooling. Shown in the figure are four resistance responses of the same $YBa_2Cu_3O_{7-x}$ filament ($I_c=0.79$ A) subjected to a 5 A pulse lasting 0.5 sec. The first curve represents the response of the filament immersed in liquid nitrogen. The second curve represents the response of the filament in contact with, but not immersed in, liquid nitrogen. The final two curves represent the filament's response during vapor cooling (the different curves represent differing degrees of gas quiesence). The substantial difference in developed resistance between these curves is obvious.

FIG. 16 illustrates the current source rise time in comparison to the fiber resistance. Both the immersed fiber resistance and the liquid nitrogen vapor cooled fiber generally track the current source. Even at times very close to the initiation of the current rise, the vapor cooled fiber demonstrates a higher resistance than the immersed fiber. Accordingly, greater fault current attenuation is possible with this method of cooling.

Figure 17:
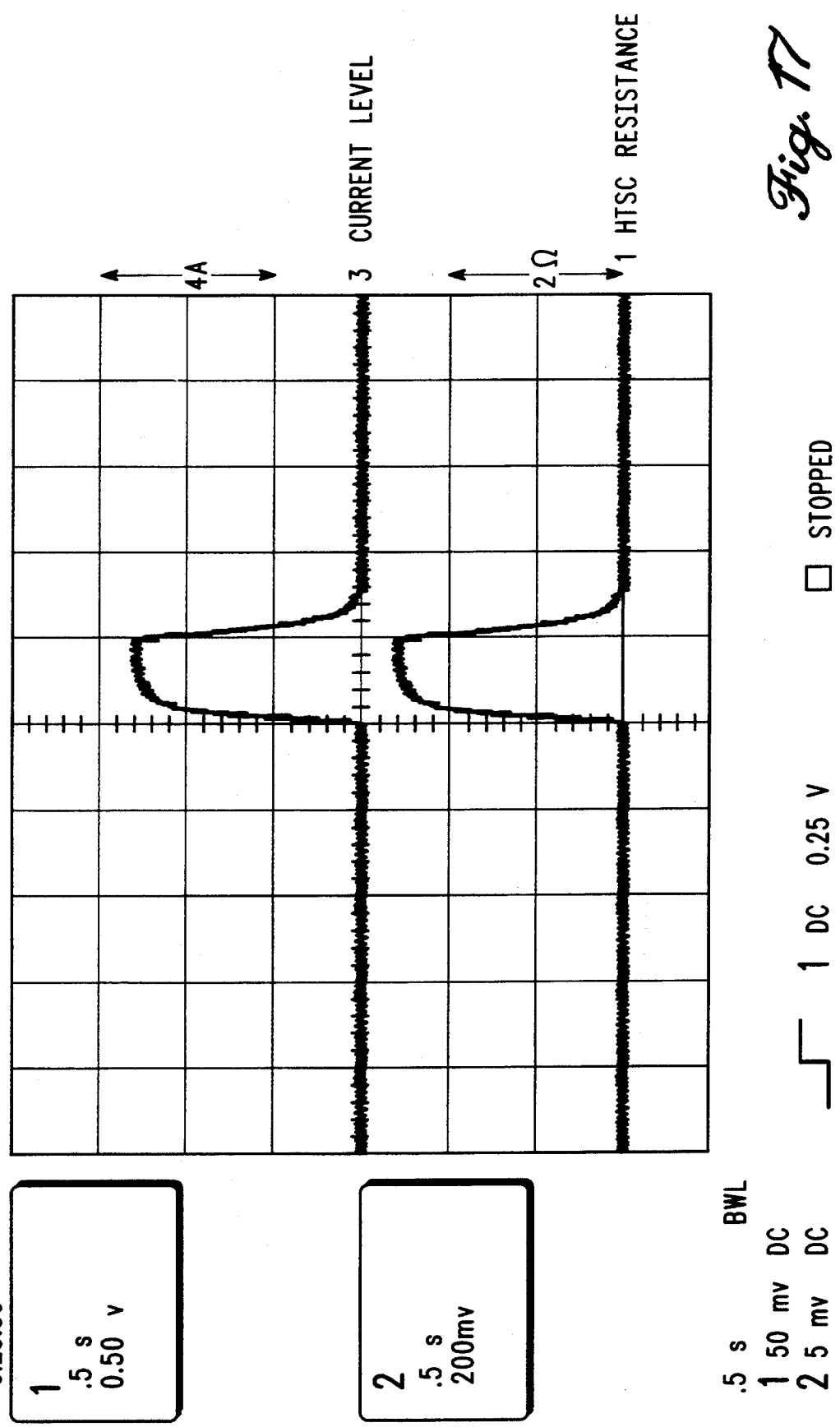
FIG. 17 shows a comparison of superconductor resistance with current source level, when a fiber is immersed in liquid nitrogen.

FIG. 17 again demonstrates current source levels versus fault current limiter superconductor element resistance. As shown, the immersed higher temperature superconductor resistance closely tracks the current source.

Figure 18:
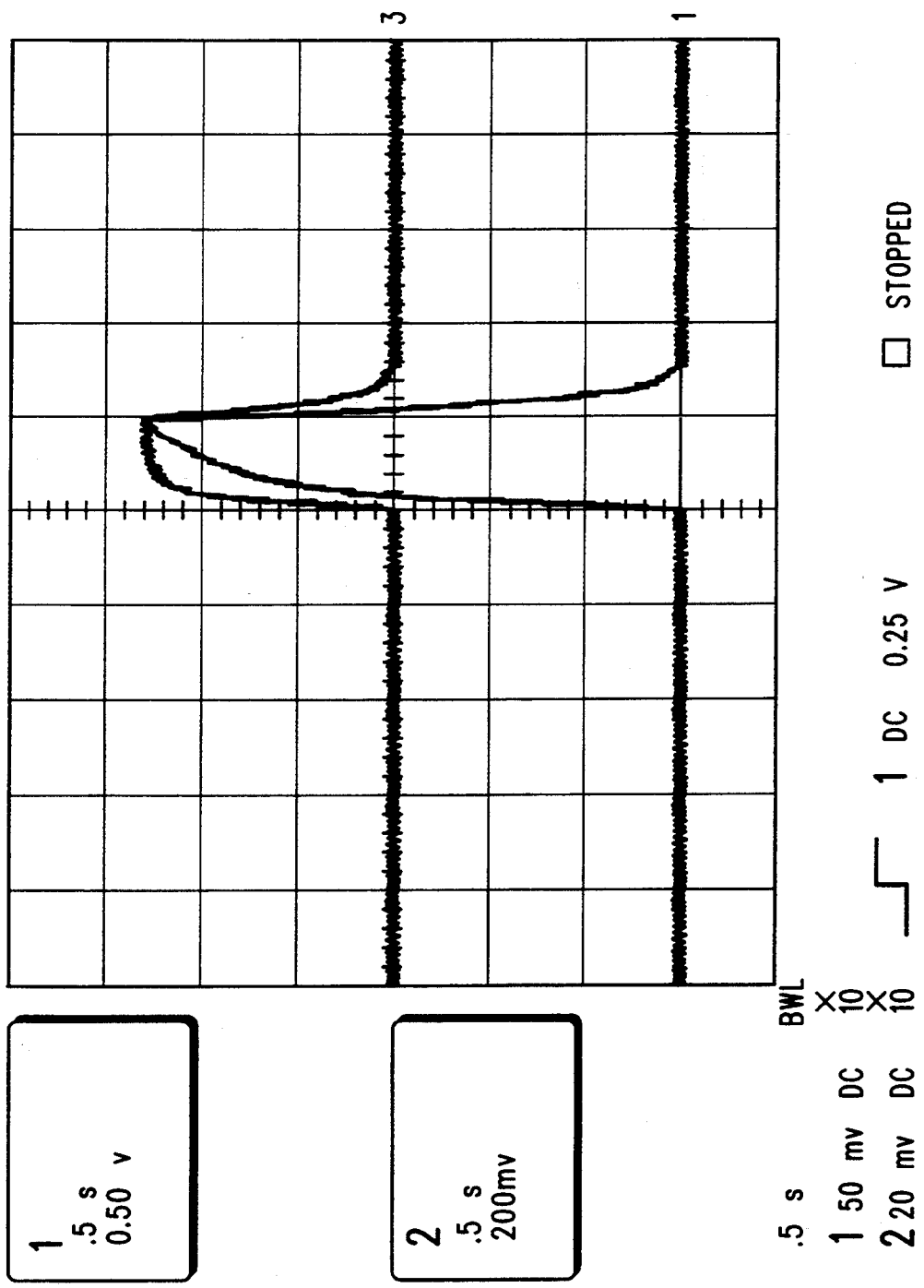
FIG. 18 shows a comparison of superconductor resistance with current level source pulse when a fiber is cooled in liquid nitrogen vapor.
Figure 19:
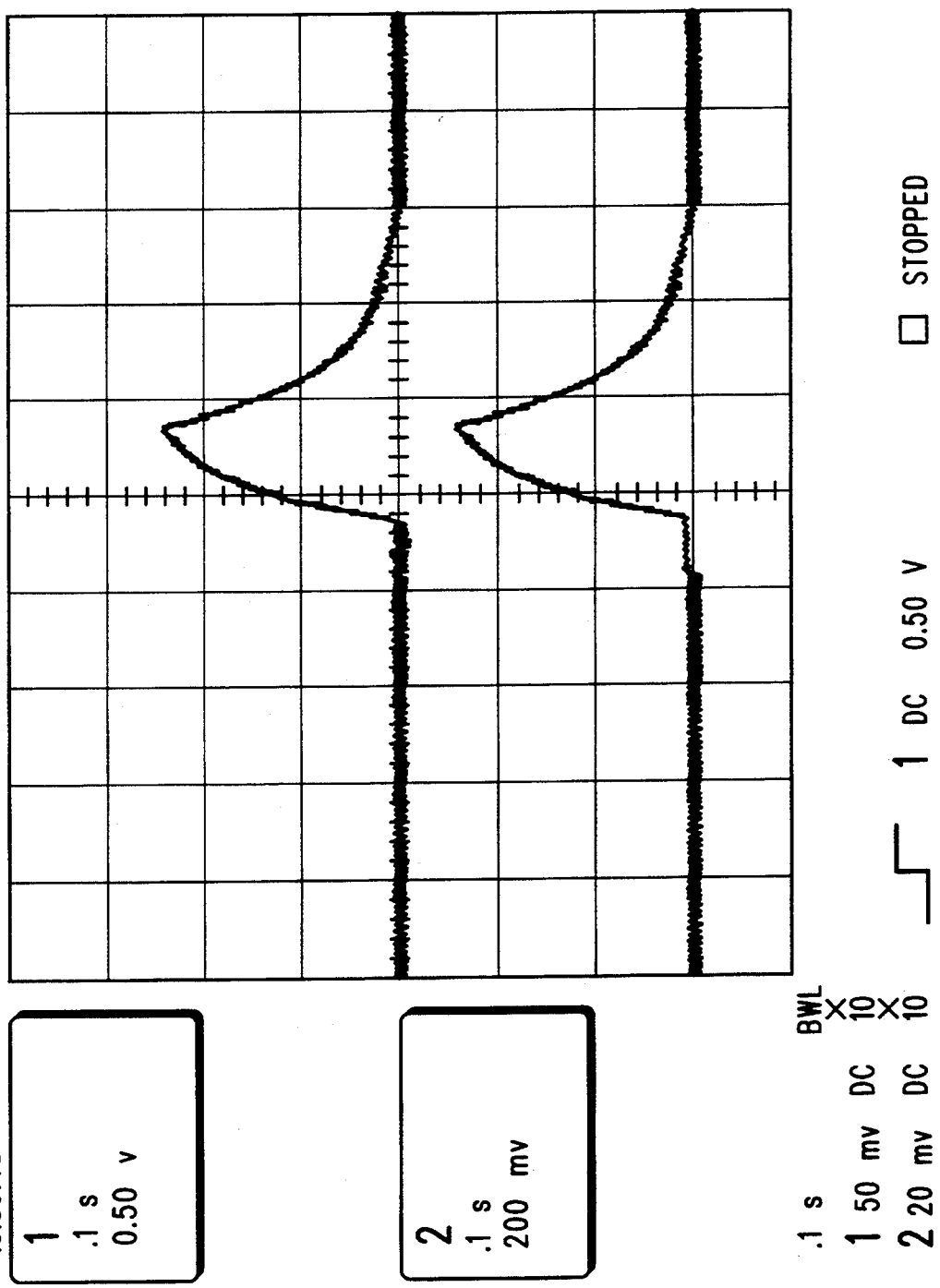
FIG. 19 shows a comparison of superconductor resistance with a current source level when a fiber is immersed in liquid nitrogen.
Figure 20:
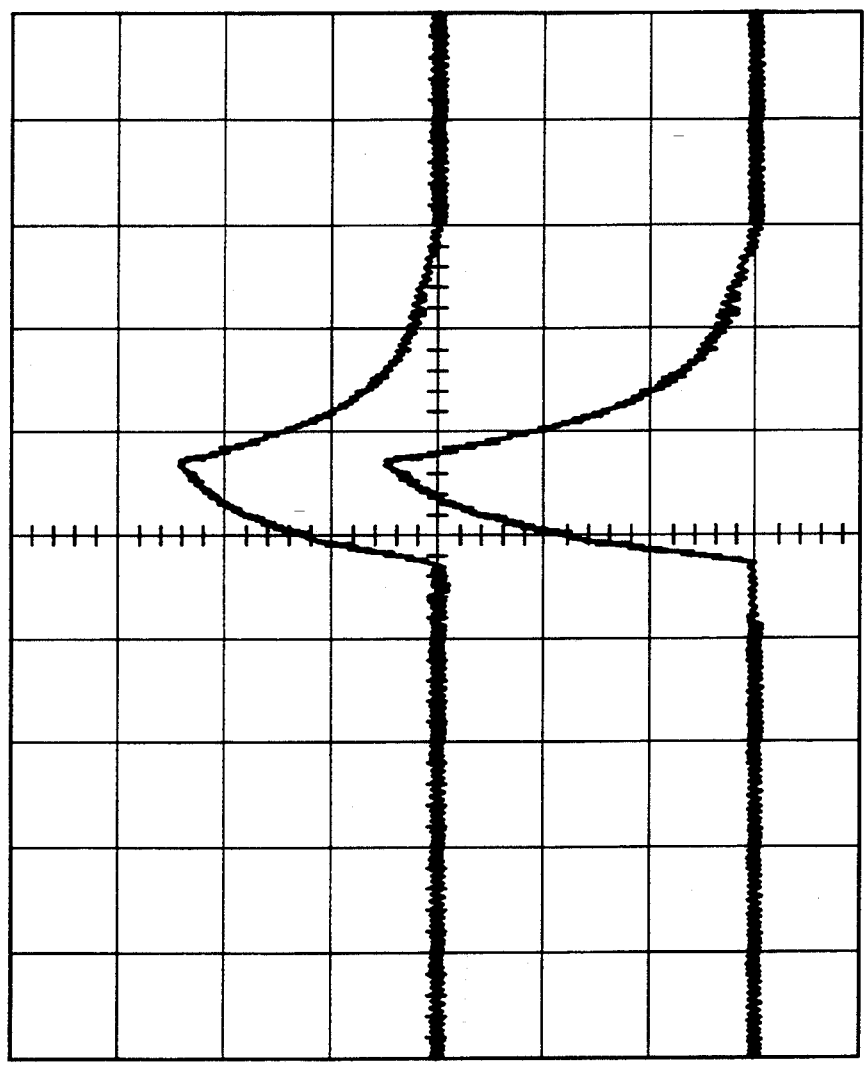
FIG. 20 shows a comparison of resistance versus a current level source pulse when a fiber is cooled in liquid nitrogen.

FIG. 18 illustrates that the vapor cooled high temperature superconductor material and the fault current limiter once again exhibits much higher resistance than the immersed material. Both FIG. 17 and FIG. 18 were obtained using a five A pulse for a duration of 0.5 sec. FIGS. 19 and 20 show immersed and vapor cooled superconductor fiber response to a five A pulse for 0.1 sec. The resistance values obtained are clearly lower, though the vapor cooled material still exhibits significantly higher resistance than its immersed counterpart.

Accordingly, utilizing carefully controlled vapor cooling in conjunction with appropriately selected fiber diameters yields a highly effective fault current limiter. Another preferred embodiment of the invention utilizes selective liquid nitrogen vapor cooling to control the fault current limiting capability of the device. The superconducting material can be allowed to operate at temperatures ranging up to approximately room temperature so long as the mechanical supports can withstand these temperature fluctuations. These high operating temperatures allow this embodiment of the invention to limit very high fault currents.

A cooling system such as the cryogenic package 12 previously described can be selectively controlled to provide variable cooling by varying cryogenic fluid flow rates or other conventional techniques. This variable cooling allows selection of a desired upper temperature operating range. This desired range can be selected to provide the amount of fault current limiting capability required by the particular application. These conditions can be described as "quasi-adiabatic" because the heat loss from the system is being controlled. In contrast, the "isothermal" designs of the prior art do not allow the superconductor material to develop the substantial resistance demonstrated by the quasi-adiabatic configurations described herein.

It has been shown that isothermal devices require approximately ten times the amount of superconductor material as required by a quasi-adiabatic device in order to achieve the same faulted resistance. Because the superconductor material is the most expensive component of the fault current limiter, this decreases the costs associated with the quasi-adiabatic fault current limiter described herein to approximately an order of magnitude lower than those of the prior art. Further, far smaller devices can be equally effective utilizing concepts of the present invention. This greatly increases the flexibility and commercial viability of these devices. Accordingly, the ability to produce an HTSC-based fault current limiter that can develop a large and controllable resistance during a fault represents a substantial benefit to the manufacture and use of such devices. Such devices will be more compact and more economical to manufacture due to their reduced size and the reduced volume of superconductor required.

EXAMPLES

The following examples are described for nonlimiting, illustrative purposes and are not intended to affect the scope of the invention in any way. Two fabrication methods were selected for preparing a conductor for use in a fault current limiter. The first method involved the fabrication of monolithic rods by isostatic pressing; the second method involves assembly of multiple extruded filaments into a bundle having the appropriate aggregate cross-section for the device. Both of these techniques are "green" forming processes, i.e., they are methods for forming the ceramic powder raw material into a shape that would be subsequently fired to form a dense body. Initial fabrication work produced sintered polycrystalline $YBa_2Cu_3O_{7-x}$. This material, while relatively easy to produce via conventional ceramic forming and sintering techniques, suffers from the drawback of being weak-linked at liquid nitrogen temperatures. In spite of this deficiency, sintered $YBa_2Cu_3O_{7-x}$ is still an acceptable choice for the fault current limiter device. "Strong-linked" high critical current $YBa_2Cu_3O_{7-x}$, produced using a technique known as "melt-texturing", can be also used satisfactorily in fault current limiter devices constructed in accordance with various forms of the invention. However, it should be noted that the primary consideration in the design and construction of a viable HTSC-based fault current limiter is the ability of the device to benignly dissipate the heat generated during a fault and while a high critical current density HTSC conductor would allow a more compact device, the substantially decreased conductor surface area of such a conductor increases the difficulty in dissipating this heat. While this would be a disadvantage in the conventional, isothermal concept of a HTSC-based fault current limiter, it is an advantage in the preferred embodiment of the invention described here, i.e., a "pseudo-adiabatic" device.

Isostatic pressing is a standard forming technique practiced in the ceramic industry, and the extension of this technology to forming monolithic rods for fault current limiters has proven successful. As generally practiced, parts are made via this technique by filling a rubber mold with raw material powder, sealing the mold, then immersing the mold in a pressure vessel that is subsequently pressurized with hydraulic fluid. For the parts made for an fault current limiter according to one form of the invention, the "mold" used was a rod die made of latex surgical tubing plugged at each end with a stopper.

A powder feedstock was prepared by milling a commercial $YBa_2Cu_3O_{7-x}$ powder in xylene containing 0.6 wt. % (by solids) of a sorbitan trioleate dispersant, which serves to ensure the suspension of the powder in the liquid during milling. The dispersant also acts as a lubricant during the pressing operation which aids in producing a uniformly dense green part. After completion of milling, the slurry was dried at room temperature and the resultant powder was sieved through a coarse screen to break up any loose agglomerates. This powder was then loaded into the rod die while the die was being vibrated to assure maximum powder packing density. The die was then isopressed at 30,000 psi. This procedure yielded strong, easily handled green rods 6 mm in diameter and up to 30 cm long. These rods were acceptable both in terms of surface finish and green density and, consequently, were used in all subsequent firing trials.

Successfully fired fine diameter filaments have been made from the particular commercial powder used in these isostatic pressing experiments. However, the large cross-sectional area of the pressed parts required for a fault current limiter presented special challenges that required a complete re-evaluation of the firing schedule needed to produce acceptable microstructures.

The reason for this reevaluation of firing schedules is intrinsic to the chemistry of the $YBa_2Cu_3O_{7-x}$ system. In $YBa_2Cu_3O_{7-x}$, copper exists in a relatively unstable superoxidized state ($Cu^{+3}$). This superoxidized copper makes the compound extremely reactive in the presence of organics. Consequently, when green formed $YBa_2Cu_3O_{7-x}$ parts are fired, extreme care is required in heating through the lower temperatures of the cycle where the organic processing aids in the parts begin to decompose. Reaction between the $YBa_2Cu_3O_{7-x}$ and the decomposing organics can be explosive, thereby resulting in a complete shattering of the part. A more subtle effect results when the binder burn-out is incomplete and a residual carbon "char" is left in the body during firing. At the firing temperature, this carbon reacts with the $YBa_2Cu_3O_{7-x}$ to form carbonates that can generate low melting liquids. The presence of these carbonate-derived liquids, in turn, can cause exaggerated grain growth during firing and leave deleterious second phases in the fired microstructure; both of which have been shown to degrade electrical performance.

To circumvent these problems in the relatively large diameter iso-pressed parts prepared for the fault current limiter, a procedure was performed involving a number of permutations of an optimized standard firing cycle for 0.035" diameter filaments. It was noted that using the standard firing cycle resulted in fired rods having unacceptable microstructures characterized by a surface "shell" of dense material surrounding a porous, apparently partially decomposed central core, with numerous macroscopic radial cracks.

Fine diameter (0.6–0.9 mm) $YBa_2Cu_3O_{7-x}$ filaments can also be used satisfactorily in a fault current limiter constructed in accordance with one form of the invention. Eighty 0.9 mm diameter by 12.5 cm long filaments, fired according to a standard firing cycle for this size filament, were stacked in a jig designed for this operation. The ends of the bundle were then painted with custom-prepared silver paint consisting of commercially available silver powder suspended in an organic vehicle. When dry, this paint served to cement the bundle together.

Figure 1:
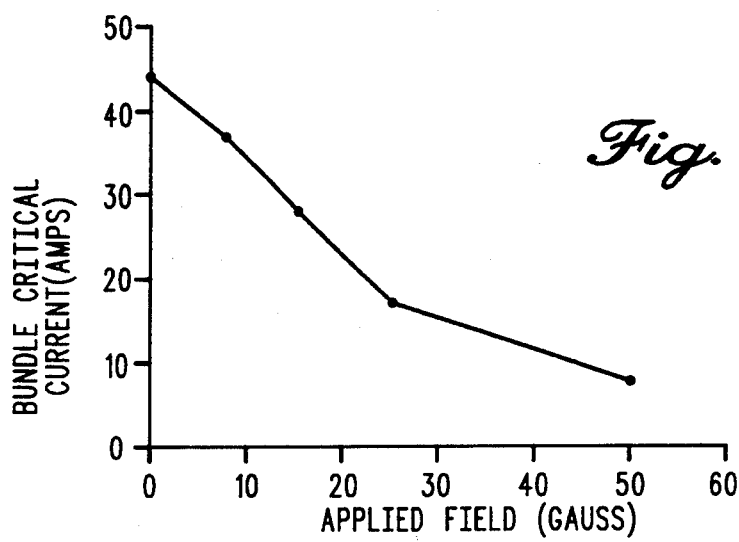
FIG. 1 illustrates the critical current response of a multifilament bundle to a magnetic field.

The assembled bundle was then fired at 800° C. for 1 hour to densify the silver end contacts, then annealed in oxygen at 450° C. for 36 hours to develop the superconducting properties of the filaments. After this firing and annealing, the bundle was tested and found to have a DC critical current of 55 amps in self-field at 77 K. For the first test of this assembly technique, "B-grade" filaments (produced using a coarser starting powder (SSC powder, ave. particle size: 4.8 μm, surface area: 0.6 $m^2/g$)) were used. This coarser powder produces a lower density, lower strength sintered filament. Consequently, the critical current of this first bundle was lower than would be expected for high quality sintered $YBa_2Cu_3O_{7-x}$. The critical current of this bundle was also tested in the presence of a magnetic field of up to 50 gauss. FIG. 1 shows a plot of critical current versus magnetic field. As would be expected for weak-linked sintered material, the $j_c$ for this configuration degrades substantially in relatively low magnetic fields.

A second, eighty-filament bundle was produced to form "A" grade filaments from CPS Superconductor powder with a surface area of 2.3 m/g and a particle size of 1.6 μm. This bundle was assembled and annealed using an optimized oxygen annealing schedule. After annealing, the bundle was tested in DC at 77 K. with zero applied field and found to have a critical current of 92 A. This current value corresponds to a critical current density of 181 $A/cm^2$ in a self magnetic field of approximately 40 gauss. This value of 92 A, therefore, appears to represent the limit of the performance that can be achieved with sintered YBCO without resorting to filament configurations that would minimize the self-field effects.

Next, directionally solidified $YBa_2Cu_3O_{7-x}$ conductors were fabricated for use in fault current limiters constructed in accordance with one form of the invention. Directionally solidified $YBa_2Cu_3O_{7-x}$, commonly referred to as "melt-textured" $YBa_2Cu_3O_{7-x}$, is produced by crystallizing this compound out of its peritectic mixture of $Y_2BaCuO_5$ plus a Ba/Cu-rich liquid.

In this melt-texturing process, a sample is typically heated above the peritectic temperature (1015° C. in air) to decompose the $YBa_2Cu_3O_{7-x}$ into $Y_2BaCuO_5$ plus liquid. This mixture is cooled slowly through the peritectic temperature allowing $YBa_2Cu_3O_{7-x}$ to crystallize. When this cooling is performed in the presence of a thermal gradient, the $YBa_2Cu_3O_{7-x}$ grains preferentially grow parallel to the gradient and a "textured" microstructure results. The slow cooling keeps the nucleation rate of $YBa_2Cu_3O_{7-x}$ low resulting in the formation of a small number of nuclei. As a result, the $YBa_2Cu_3O_{7-x}$ grains can grow to very large sizes before impingement and, if the cooling is performed in a thermal gradient, will be highly textured (aligned). Conventionally, such samples have been tested and determined to have critical currents of up to 17,000 $A/cm^2$ in self-field with only a small magnetic field dependence.

A significant modification of conventional techniques has been described. Termed "quench-melt-growth" (QMG), it uses a precursor made by melting a $YBa_2Cu_3O_{7-x}$ composition above the $Y_2BaCuO5$ peritectic temperature (1260° C. in air) to produce a mixture of $Y_2O_3$ and liquid, which is quenched to room temperature. After grinding, the resultant powder is pressed into a pellet, reheated above the $YBa_2Cu_3O_{7-x}$ peritectic temperature and slowly cooled. This technique results in a much finer dispersion of $Y_2BaCuO_5$ particles in both the peritectic liquid and the final crystallized microstructure. The electrical characteristics in a magnetic field are markedly improved when compared to conventional melt-texturing results, i.e., values of up to 70,000 $A/cm^2$ in self-field have been reported.

The melt-texturing process, while effective in producing strong-linked, high critical current superconductors, has drawbacks that have limited its use to the fabrication of small samples. First, melt-texturing requires that material be processed in temperature regimes where a significant fraction of the sample is molten. Consequently, during a large portion of the processing time, the sample has little structural integrity. Second, the significant amount of Ba/Cu-rich liquid that forms at high temperatures is extremely reactive with most metals and metal oxides. Third, the peritectic liquid phase has the somewhat unique property of poorly wetting $Y_2BaCuO_5$, the solid portion of the peritectic mixture. As a result, physically supporting samples during processing is extremely difficult with common refractory materials. Finally, as the melt-texturing process is in actuality a crystal growth process, the rate at which textured material is produced is inherently very slow.

In spite of these drawbacks, the continuous production of continuous lengths of melt-textured filaments with high critical current densities has been demonstrated. Presently, rates of production of melt-textured filaments of this type are low (typically 3–10 mm/hr). Thus, the low crystal growth rate makes use of this process to produce continuous lengths of filaments for wire applications somewhat undesirable. However, use of this process to produce the relatively short conductor elements required for current limiter applications is eminently feasible.

The following are first order thermal calculations and data relating to first, a quasi-adiabatic fault current limiter and second, an isothermal fault current limiter:

THERMAL CALCULATIONS FOR A QUASI-ADIABATIC FAULT CURRENT LIMITER

Assumptions:
1. Constant current during fault
2. Resistivity independent of temperature
3. Process is adiabatic during early stages of fault

Calculation Inputs:

| | | Source |
|---|---|---|
| Device Current Rating (Amps): | 50 | Design Rating |
| YBCO Current Density (Amps/cm^2): | 1000 | ISC Measurement |
| YBCO Faulted Resistivity (ohm-cm): | 0.00008 | ISC Measurement |
| YBCO Thermal Conductivity (W/m-K): | 4 | C. Uher, J. Supercon., (3)4, p. 337, (199) |
| YBCO Density (g/cm^3): | 6.22 | |
| YBCO Heat Capacity (J/mole-K): | 10 | Fisher, et al., (1988) |
| YBCO Molecular Weight (g): | 663 | |

Calculated Constants:

| | |
|---|---|
| YBCO Specific Heat (J/g-K): | 0.015083 |
| YBCO Thermal Diffusivity (m^2/sec): | 0.000043 |
| YBCO Conductor Diameter (m): | 0.001262 |
| Device Resistance/Meter: | 0.16 |

-continued

THERMAL CALCULATIONS FOR A QUASI-ADIABATIC FAULT CURRENT LIMITER

| | |
|---|---|
| Device Weight/Meter: | 31.1 |

Calculations

*Calculation of rod temperature rise during a fault*

| Time (msec) | Temp (K.) | Recover (ms) |
|---|---|---|
| *Fault Current: 110.00% in percentage of rated current* | | |
| 1 | 78.03 | 0 |
| 2 | 79.06 | 0 |
| 3 | 80.10 | 0 |
| 4 | 81.13 | 0 |
| 5 | 82.16 | 0 |
| 6 | 83.19 | 0 |
| 7 | 84.22 | 0 |
| 8 | 85.25 | 0 |
| 9 | 86.29 | 0 |
| 10 | 87.32 | 0 |
| 11 | 88.35 | 0 |
| 12 | 89.38 | 0 |
| 13 | 90.41 | 15 |
| 14 | 91.45 | 15 |
| 15 | 92.48 | 16 |
| 16 | 93.51 | 16 |
| 17 | 94.54 | 17 |
| 18 | 95.57 | 17 |
| 19 | 96.60 | 17 |
| 20 | 97.64 | 18 |
| 25 | 102.80 | 19 |
| 30 | 107.95 | 20 |
| 35 | 113.11 | 21 |
| 40 | 118.27 | 22 |
| 45 | 123.43 | 23 |
| 50 | 128.59 | 24 |
| 60 | 138.91 | 25 |
| 70 | 149.23 | 26 |
| 80 | 159.54 | 27 |
| 90 | 169.86 | 27 |
| 100 | 180.18 | 28 |
| *Fault Current: 200.00% in percentage of rated current* | | |
| 1 | 80.41 | 0 |
| 2 | 83.82 | 0 |
| 3 | 87.23 | 0 |
| 4 | 90.64 | 15 |
| 5 | 94.05 | 17 |
| 6 | 97.47 | 18 |
| 7 | 100. 88 | 19 |
| 8 | 104.29 | 20 |
| 9 | 107.70 | 20 |
| 10 | 111.11 | 21 |
| 11 | 114.52 | 22 |
| 12 | 117.93 | 22 |
| 13 | 121.34 | 23 |
| 14 | 124.75 | 23 |
| 15 | 128.16 | 24 |
| 16 | 131.57 | 24 |
| 17 | 134.99 | 24 |
| 18 | 138.40 | 25 |
| 19 | 141.81 | 25 |
| 20 | 145.22 | 25 |
| 25 | 162.27 | 27 |
| 30 | 179.33 | 28 |
| 35 | 196.38 | 29 |
| 40 | 213.44 | 30 |
| 45 | 230.49 | 31 |
| 50 | 247.55 | 31 |
| 60 | 281.66 | 33 |
| 70 | 315.77 | 34 |
| 80 | 349.87 | 34 |
| 90 | 383.98 | 35 |
| 100 | 418.09 | 36 |
| *Fault Current: 1000.00% in percentage of rated current* | | |
| 1 | 162.27 | 27 |
| 2 | 247.55 | 31 |
| 3 | 332.82 | 34 |
| 4 | 418.09 | 36 |
| 5 | 503.37 | 37 |
| 6 | 588.64 | 38 |
| 7 | 673.91 | 39 |
| 8 | 759.19 | 40 |
| 9 | 844.46 | 41 |

THERMAL CALCULATIONS FOR A QUASI-ADIABATIC FAULT CURRENT LIMITER (continued)

| | | |
|---|---|---|
| 10 | 929.73 | 42 |
| 11 | 1015.01 | 42 |
| 12 | 1100.28 | 43 |
| 13 | 1185.55 | 43 |
| 14 | 1270.83 | 43 |
| 15 | 1356.10 | 44 |
| 16 | 1441.37 | 44 |
| 17 | 1526.65 | 44 |
| 18 | 1611.92 | 45 |
| 19 | 1697.19 | 45 |
| 20 | 1782.47 | 45 |
| 25 | 2208.83 | 46 |
| 30 | 2635.20 | 47 |
| 35 | 3061.57 | 47 |
| 40 | 3487.93 | 48 |
| 45 | 3914.30 | 48 |
| 50 | 4340.67 | 48 |
| 60 | 5193.40 | 49 |
| 70 | 6046.13 | 49 |
| 80 | 6898.86 | 50 |
| 90 | 7751.60 | 50 |
| 100 | 8604.33 | 50 |

Device temperature at circuit breaker activation (8 msec)
Time (resec): 8

| | | |
|---|---|---|
| 101.00% | 83.96 | 0 |
| 102.00% | 84.10 | 0 |
| 103.00% | 84.24 | 0 |
| 104.00% | 84.38 | 0 |
| 105.00% | 84.52 | 0 |
| 106.00% | 84.67 | 0 |
| 107.00% | 84.81 | 0 |
| 108.00% | 84.96 | 0 |
| 109.00% | 85.11 | 0 |
| 110.00% | 85.25 | 0 |
| 120.00% | 86.82 | 0 |
| 130.00% | 88.53 | 0 |
| 140.00% | 90.37 | 15 |
| 150.00% | 92.35 | 16 |
| 160.00% | 94.46 | 17 |
| 170.00% | 96.72 | 17 |
| 180.00% | 99.10 | 18 |
| 190.00% | 101.63 | 19 |
| 200.00% | 104.29 | 20 |
| 250.00% | 119.64 | 22 |
| 300.00% | 138.40 | 25 |
| 350.00% | 160.57 | 27 |
| 400.00% | 186.15 | 28 |
| 450.00% | 215.14 | 30 |
| 500.00% | 247.55 | 31 |
| 600.00% | 322.59 | 34 |
| 700.00% | 411.27 | 36 |
| 800.00% | 513.60 | 37 |
| 900.00% | 629.57 | 39 |
| 1000.00% | 759.19 | 40 |

THERMAL CALCULATIONS FOR AN "ISOTHERMAL" FAULT CURRENT LIMITER

Use Carslaw and Jaeger's solution for heat production in an infinite cylinder (2nd Ed., Section 7.9.1)

Assumptions:
1. Constant current during fault
2. Resistivity independent of temperature
3. Thermal conductivity independent of temperature

Calculation Inputs:

| | | Source |
|---|---|---|
| Device Current Rating (Amps): | 50 | Design Rating |
| YBCO Current Density (Amps/cm^2): | 1000 | ISC Measurement |
| YBCO Faulted State Resistivity (ohm-cm): | 0.000031 | ISC Measurement |
| YBCO Thermal Conductivity (W/m-K): | 5 | C. Uher, J. Supercon., (3)4, p. 337, (1990) |
| YBCO Density (g/cm^3): | 6.22 | |
| YBCO Heat Capacity (J/mole-K): | 7.5 | Fisher, et al., (1988) |
| YBCO Molecular Weight (g/mole): | 663 | Calculated |

Calculated Constants:

| | | |
|---|---|---|
| YBCO Specific Heat (J/g-K): | 0.011312 | |
| YBCO Thermal Diffusivity (m^2/sec): | 0.000071 | |
| Current Limiter Radius (m): | 0.001262 | |
| Current Limiter Dissipation Factor: | 12400 | This value times the fault current gives the heat generated/ second during a fault |

Calculations

Calculation of rod centerline temperature rise during a fault

| Time (msec) | Temperature (K.) |
|---|---|

Fault Current: 110.00% in percentage of rated current
Term1: 2.984944
SumCoefficient: 23.87955

| | |
|---|---|
| 1 | 77.45195797 |
| 2 | 78.03970367 |
| 3 | 78.47059175 |
| 4 | 78.81167257 |
| 5 | 79.07774696 |
| 6 | 79.28395887 |
| 7 | 79.44342038 |
| 8 | 79.56663881 |
| 9 | 79.66182817 |
| 10 | 79.73535835 |
| 11 | 79.7921561 |
| 12 | 79.83602862 |
| 13 | 79.86991715 |
| 14 | 79.89609371 |
| 15 | 79.9163133 |
| 16 | 79.93193153 |
| 17 | 79.94399553 |
| 18 | 79.95331414 |
| 19 | 79.96051212 |
| 20 | 79.96607206 |
| 25 | 79.97975462 |
| 30 | 79.98351702 |
| 35 | 79.9845516 |
| 40 | 79.98483608 |
| 45 | 79.98491431 |
| 50 | 79.98493582 |
| 60 | 79.98494336 |
| 70 | 79.98494393 |
| 80 | 79.98494397 |
| 90 | 79.98494398 |
| 100 | 79.98494398 |

Fault Current: 200.00% in percentage of rated current
Term1: 9.867583
SumCoefficient: 78.94067

| | |
|---|---|
| 1 | 78.49407595 |
| 2 | 80.43703692 |
| 3 | 81.86146033 |
| 4 | 82.98900024 |
| 5 | 83.86858499 |
| 6 | 84.55027727 |
| 7 | 85.07742275 |
| 8 | 85.48475639 |
| 9 | 85.79943196 |
| 10 | 86.04250695 |
| 11 | 86.23026808 |
| 12 | 86.37530121 |
| 13 | 86.48732943 |
| 14 | 86.57386352 |
| 15 | 86.64070512 |
| 16 | 86.69233563 |
| 17 | 86.73221663 |
| 18 | 86.76302194 |
| 19 | 86.78681691 |
| 20 | 86.80519688 |
| 25 | 86.85042848 |
| 30 | 86.86286617 |
| 35 | 86.86628626 |
| 40 | 86.86722671 |

THERMAL CALCULATIONS FOR AN "ISOTHERMAL" FAULT CURRENT LIMITER

| | |
|---|---|
| 45 | 86.86748532 |
| 50 | 86.86755643 |
| 60 | 86.86758136 |
| 70 | 86.86758324 |
| 80 | 86.86758339 |
| 90 | 86.8675834 |
| 100 | 86.8675834 |

Fault Current: 1000.00% in percentage of rated current
Term1: 246.6896
SumCoefficient: 1973.517

| | |
|---|---|
| 1 | 114.3518987 |
| 2 | 162.9259229 |
| 3 | 198.5365084 |
| 4 | 226.7250059 |
| 5 | 248.7146247 |
| 6 | 265.7569318 |
| 7 | 278.9355689 |
| 8 | 289.1189097 |
| 9 | 296.9857991 |
| 10 | 303.0626737 |
| 11 | 307.7567021 |
| 12 | 311.3825303 |
| 13 | 314.1832358 |
| 14 | 316.346588 |
| 15 | 318.017628 |
| 16 | 319.3083909 |
| 17 | 320.3054158 |
| 18 | 321.0755486 |
| 19 | 321.6704228 |
| 20 | 322.129922 |
| 25 | 323.260712 |
| 30 | 323.5716543 |
| 35 | 323.6571566 |
| 40 | 323.6806679 |
| 45 | 323.6871329 |
| 50 | 323.6889107 |
| 60 | 323.6895339 |
| 70 | 323.6895811 |
| 80 | 323.6895846 |
| 90 | 323.6895849 |
| 100 | 323.6895849 |

Centerline temperature at circuit breaker activation (8 msec)
Time (resec): 8
Summation term: 0.017517

| Fault Current | Temperature |
|---|---|
| 101.00% | 79.163825 |
| 102.00% | 79.20688514 |
| 103.00% | 79.25036951 |
| 104.00% | 79.29427813 |
| 105.00% | 79.33861098 |
| 106.00% | 79.38336807 |
| 107.00% | 79.4285494 |
| 108.00% | 79.47415496 |
| 109.00% | 79.52018477 |
| 110.00% | 79.56663881 |
| 120.00% | 80.0545123 |
| 130.00% | 80.58480957 |
| 140.00% | 81.15753063 |
| 150.00% | 81.77267547 |
| 160.00% | 82.43024409 |
| 170.00% | 83.13023649 |
| 180.00% | 83.87265267 |
| 190.00% | 84.65749264 |
| 200.00% | 85.48475639 |
| 220.00% | 87.26655523 |
| 240.00% | 89.2180492 |
| 260.00% | 91.33923829 |
| 280.00% | 93.63012252 |
| 300.00% | 96.09070187 |
| 320.00% | 98.72097635 |
| 340.00% | 101.520946 |
| 360.00% | 104.4906107 |
| 380.00% | 107.6299706 |
| 400.00% | 110.9390255 |
| 420.00% | 114.4177757 |
| 440.00% | 118.0662209 |
| 460.00% | 121.8843613 |
| 480.00% | 125.8721968 |
| 500.00% | 130.0297274 |
| 550.00% | 141.1659702 |
| 600.00% | 153.3628075 |
| 650.00% | 166.6202393 |
| 700.00% | 180.9382657 |
| 750.00% | 196.3168867 |
| 800.00% | 212.7561022 |
| 850.00% | 230.2559122 |
| 900.00% | 248.8163168 |
| 950.00% | 268.437316 |
| 1000.00% | 289.1189097 |

While preferred embodiments have been illustrated and described, it should be understood that changes and modifications can be made therein without departing from the invention in its broader aspects. Various features of the invention are defined in the following claims.

What is claimed is:

1. A fault current limiter for a circuit having an electrical current carrying path, comprising a high temperature superconductor disposed in said current carrying path, said superconductor being cooled by a flowing gaseous cooling medium while allowing rapid temperature rise of said high temperature superconductor to a higher temperature above the critical temperature of said high temperature superconductor during operation as said fault current limiter, said high temperature superconductor developing substantial electrical resistance at said higher temperature to attenuate a fault current, and after the fault current condition ceases, said high temperature superconductor being cooled and automatically returning to a superconducting state.

2. The fault current limiter as defined in claim 1 wherein said flowing gaseous cooling medium comprises liquid nitrogen vapor at a temperature higher than the boiling point of liquid nitrogen and less than the transition temperature of said high temperature superconductor.

3. The fault current limiter as defined in claim 1, wherein said superconductor comprises a plurality of elongated structures.

4. The fault current limiter as defined in claim 3, wherein at least two of said elongated structures are interconnected.

5. The fault current limiter as defined in claim 1, wherein said superconductor comprises $YBa_2Cu_3O_{7-x}$.

6. The fault current limiter as defined in claim 1 further including a resistor disposed in parallel with said superconductor in said circuit.

7. The device of claim 6, wherein said resistor receives current from said circuit only after said fault current limiter has reached a predetermined resistivity.

8. A method of operating a fault current limiter, comprising the steps of:
 selecting a high temperature superconductor element for use in said fault current limiter;
 placing said fault current limiter in a circuit having an electrical current carrying path;
 allowing said high temperature superconductor element to operate above its critical temperature;
 selectively cooling said high temperature superconductor element to substantially control operation of said fault current limiter; and
 producing in said temperature superconductor element a voltage proportional to at least the fourteenth power of input current for the high temperature superconductor element.

9. The method as defined in claim 8, wherein controlling said operation of said fault current limiter includes changing resistance of said fault current limiter by changing the flow rate of a gaseous cooling medium having a temperature between the boiling point of the cooling medium and the critical temperature of the high temperature superconductor element.

10. The method as defined in claim 8, further comprising the step of:

placing in said circuit a circuit breaker capable of controlling a period of operation of said fault current limiter.

11. The method as defined in claim 8 wherein said high temperature superconductor element comprises a substantially resistive electrical component.

12. The method as defined in claim 8, wherein said superconductor element comprises a plurality of elongated structures.

13. The method as defined in claim 12, wherein at least two of said elongated structures are interconnected.

14. A fault current limiter for a circuit having an electrical current carrying path, comprising a high temperature superconductor disposed in said current carrying path, said high temperature superconductor operating as said fault current limiter only upon exceeding its critical temperature and said high temperature superconductor further including nitrogen vapor cooling at a temperature above the boiling point of nitrogen and less than the critical temperature of the high temperature superconductor during a fault condition enabling rapid heating of the high temperature superconductor and producing a high temperature superconductor voltage proportional to at least the fourteenth power of input current for the high temperature superconductor.

15. The fault current limiter as defined in claim 14, wherein said high temperature superconductor comprises a substantially resistive electrical component.

16. The fault current limiter as defined in claim 14, wherein said high temperature superconductor comprises a plurality of elongated structures.

17. The fault current limiter as defined in claim 16, wherein at least two of said elongated structures are interconnected.

18. The fault current limiter as defined in claim 14, wherein said high temperature superconductor comprises $YBa_2Cu_3O_{7-x}$.

19. The fault current limiter as defined in claim 14, further including a resistor disposed in parallel with said high temperature superconductor in said circuit.

20. The device of claim 19, wherein said resistor receives current from said circuit only after said fault current limiter has reached a predetermined resistivity.

21. A fault current limiter for a circuit having an electrical current carrying path, comprising a high temperature superconductor disposed in said current carrying path, said superconductor being cooled by a flowing gaseous cooling means for providing limited cooling of said superconductor while allowing rapid temperature rise of said high temperature superconductor to a higher temperature above the critical temperature of said high temperature superconductor during operation as said fault current limiter, said high temperature superconductor developing substantial electrical resistance at said higher temperature to attenuate a fault current, and after the fault current condition ceases, said high temperature superconductor being cooled by said flowing gaseous cooling means and automatically returning to a superconducting state.

22. A fault current limiter system for a circuit having an electrical current carrying path, said system comprising:

a high temperature superconductor disposed in said current carrying path; and means for cooling said superconductor composed of a flowing gaseous cooling medium while allowing rapid temperature rise of said high temperature superconductor to a higher temperature above the critical temperature of said high temperature superconductor during operation as said fault current limiter system, said high temperature superconductor developing substantial electrical resistance at said higher temperature to attenuate a fault current, and after the fault current condition ceases, said high temperature superconductor being cooled and automatically returning to a superconducting state.

* * * * *